(12) United States Patent
Kang et al.

(10) Patent No.: US 8,885,394 B2
(45) Date of Patent: Nov. 11, 2014

(54) SEMICONDUCTOR DEVICE WITH COMPLEMENTARY GLOBAL BIT LINES, OPERATING METHOD, AND MEMORY SYSTEM

(75) Inventors: Byung-Ho Kang, Suwon-si (KR); Yong Jin Yoon, Seoul (KR); Young Jae Son, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 13/604,743

(22) Filed: Sep. 6, 2012

(65) Prior Publication Data
US 2013/0083592 A1 Apr. 4, 2013

(30) Foreign Application Priority Data

Sep. 29, 2011 (KR) .................. 10-2011-0099109

(51) Int. Cl.
*G11C 11/00* (2006.01)
*G11C 7/12* (2006.01)
*G11C 7/18* (2006.01)
*G11C 11/419* (2006.01)

(52) U.S. Cl.
CPC ............... *G11C 11/419* (2013.01); *G11C 7/12* (2013.01); *G11C 7/18* (2013.01)
USPC .................. 365/156; 365/189.05; 365/203

(58) Field of Classification Search
USPC .................. 365/156, 189.05, 203, 230.03
See application file for complete search history.

(56) References Cited

U.S. PATENT DOCUMENTS

| 6,452,851 | B1 * | 9/2002 | Endo et al. | 365/205 |
| 6,542,424 | B2 * | 4/2003 | Endo et al. | 365/205 |
| 7,746,685 | B2 | 6/2010 | Kawasumi et al. | |
| 7,830,727 | B2 | 11/2010 | Arsovski et al. | |
| 7,839,704 | B2 * | 11/2010 | Murata | 365/189.16 |

FOREIGN PATENT DOCUMENTS

| JP | 2009-070846 | 4/2009 |
| KR | 1020060012700 A | 2/2006 |

* cited by examiner

*Primary Examiner* — Son Dinh
(74) *Attorney, Agent, or Firm* — Volentine & Whitt, PLLC

(57) ABSTRACT

A memory device includes sections arranged between a global bit line and a complementary global bit line, and having a section control unit disposed between first and second memory cell groups and connected between the global bit line and the complementary global bit line to provide a first read signal and a second read signal. A signal converter receives the first and second read signals and generates a stable controlled read signal indicative of a data value stored in the memory cell. A latch unit receives and latches the controlled read signal provided by the signal converter to generate a latched read signal.

20 Claims, 15 Drawing Sheets

SEMICONDUCTOR DEVICE WITH COMPLEMENTARY GLOBAL BIT LINES, OPERATING METHOD, AND MEMORY SYSTEM

CROSS-REFERENCE TO RELATED APPLICATIONS

This application claims priority under 35 U.S.C. §119(a) from Korean Patent Application No. 10-2011-0099109 filed on Sep. 29, 2011, the subject matter of which is hereby incorporated by reference.

BACKGROUND OF THE INVENTION

The inventive concept relates generally to semiconductor devices. More particularly, the inventive concept relates to semiconductor devices capable of converting an output signal into a static signal without a trigger signal. The inventive concept also relates to operating methods for and memory systems including these types of semiconductor devices.

During a read operation directed to (e.g.,) a binary memory cell in a semiconductor device (e.g., a static random access memory—SRAM), a data value of "0" or "1" may be indicated for the memory cell by discharging a bit line pair that has previously been pre-charged. During this process, the data signal provided by the semiconductor device is dynamic (e.g., variable) in nature. However, in order to usefully output the data value read from the memory cell to an external logic circuit, this dynamic signal must first be converted into a static signal that may be interrupted as a stable digital output signal.

SUMMARY OF THE INVENTION

According to some embodiments of the inventive concept, there is provided a semiconductor device comprising; a plurality of memory banks, wherein each memory bank in the plurality of memory banks includes a plurality of sections arranged between a global bit line and a complementary global bit line, and each section in the plurality of sections includes a first memory cell group and a second memory cell group connected between a local bit line and a complementary local bit line and a section control unit disposed between the first memory cell group and the second memory cell group, wherein the section control unit is connected between the global bit line and the complementary global bit line to provide a first read signal to the global bit line and a second read signal to the complementary global bit line in response to a read operation directed to a memory cell in one of the first memory cell group and the second memory cell group, a signal converter that receives the first read signal via the global bit line and the second read signal via the complementary global bit line in response to the read operation and generates a stable controlled read signal indicative of a data value stored in the memory cell, and a latch unit that receives and latches the controlled read signal provided by the signal converter to generate a latched read signal.

According to some embodiments of the inventive concept, there is provided a method of operating a semiconductor device, wherein the semiconductor device includes a plurality of sections arranged between a global bit line and a complementary global bit line, each section including a first memory cell group and a second memory cell group connected between a local bit line and a complementary local bit line and a section control unit disposed between the first memory cell group and the second memory cell group and connected between the global bit line and the complementary global bit line, the method comprising; pre-charging the global bit line and the complementary global bit line, sensing and amplifying a dynamic read signal provided by a memory cell during a read operation to provide a first read signal via the global bit line and a second read signal via the complementary global bit line, wherein the first read signal is different from the second read signal, generating a stable controlled read signal having a value defined by the first read signal and the second read signal, as respectively communicated via the global bit line and the complementary global bit line, and latching the controlled read signal to generate a latched read signal.

According to some embodiments of the inventive concept, there is provided a memory system comprising; a non-volatile memory device, and a memory controller configured to control operation of the non-volatile memory device and comprising a memory device and a microprocessor configured to control operation of the memory device. The memory device comprises; a plurality of memory banks, wherein each memory bank in the plurality of memory banks includes a plurality of sections arranged between a global bit line and a complementary global bit line, and each section in the plurality of sections includes a first memory cell group and a second memory cell group connected between a local bit line and a complementary local bit line and a section control unit disposed between the first memory cell group and the second memory cell group, wherein the section control unit is connected between the global bit line and the complementary global bit line to provide a first read signal to the global bit line and a second read signal to the complementary global bit line in response to a read operation directed to a memory cell in one of the first memory cell group and the second memory cell group, a signal converter that receives the first read signal via the global bit line and the second read signal via the complementary global bit line in response to the read operation and generates a stable controlled read signal indicative of a data value stored in the memory cell, and a latch unit that receives and latches the controlled read signal provided by the signal converter to generate a latched read signal.

BRIEF DESCRIPTION OF THE DRAWINGS

The above and other features and advantages of the inventive concept will become more apparent upon consideration of certain embodiments described hereafter with reference to the attached drawings in which.

DETAILED DESCRIPTION

Embodiments of the inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels denote like or similar elements and/ or features.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
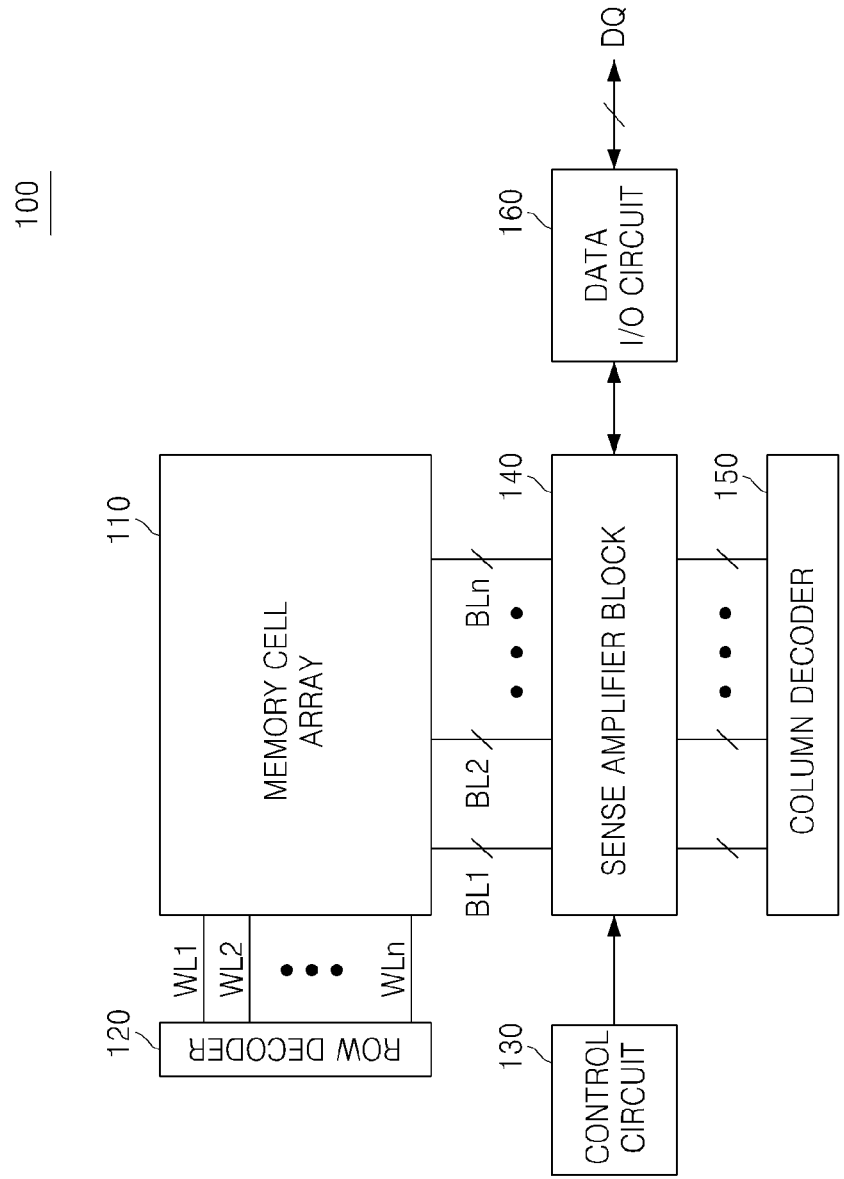
FIG. 1 is a block diagram of a semiconductor device according to certain embodiments of the inventive concept.

FIG. 1 is a block diagram of a semiconductor device 100 according to certain embodiments of the inventive concept. The semiconductor device 100 comprises a memory cell array 110, a row decoder 120, a control circuit 130, a sense amplifier block 140, a column decoder 150, and a data input/ output (I/O) circuit 160.

The memory cell array 110 includes a plurality of word line WL1 through WLn, a plurality of bit lines BL1 through BLn, and a plurality of memory cells capable of storing data. Each of the bit lines BL1 through BLn includes a bit line (BL) and a complementary bit line (BLB).

The row decoder 120 decodes a row address, selects one of the word line WL1 through WLn according to the decoding result, and generates a word line selection signal (not shown).

The control circuit 130 controls the operation of the sense amplifier block 140 based on an externally provided control signal (not shown).

The sense amplifier block 140 senses and amplifies data of a memory cell and stores data in the memory cell. The sense amplifier block 140 includes a plurality of sense amplifiers (not shown) for sensing and amplifying data corresponding to each of the bit lines BL1 through BLn. Each of the sense amplifiers senses and amplifies data of each of the bit lines BL1 through BLn in response to a control signal output from the control circuit 130.

The column decoder 150 decodes a column address and generates a plurality of column selection signals according to the decoding result.

The data I/O circuit 160 transmits externally input write data to the sense amplifier block 140 according to a plurality of column selection signals output from the column decoder 150 and outputs read data, which has been sensed and amplified by the sense amplifier block 140 according to a plurality of column selection signals output from the column decoder 150, to an outside.

Figure 2:
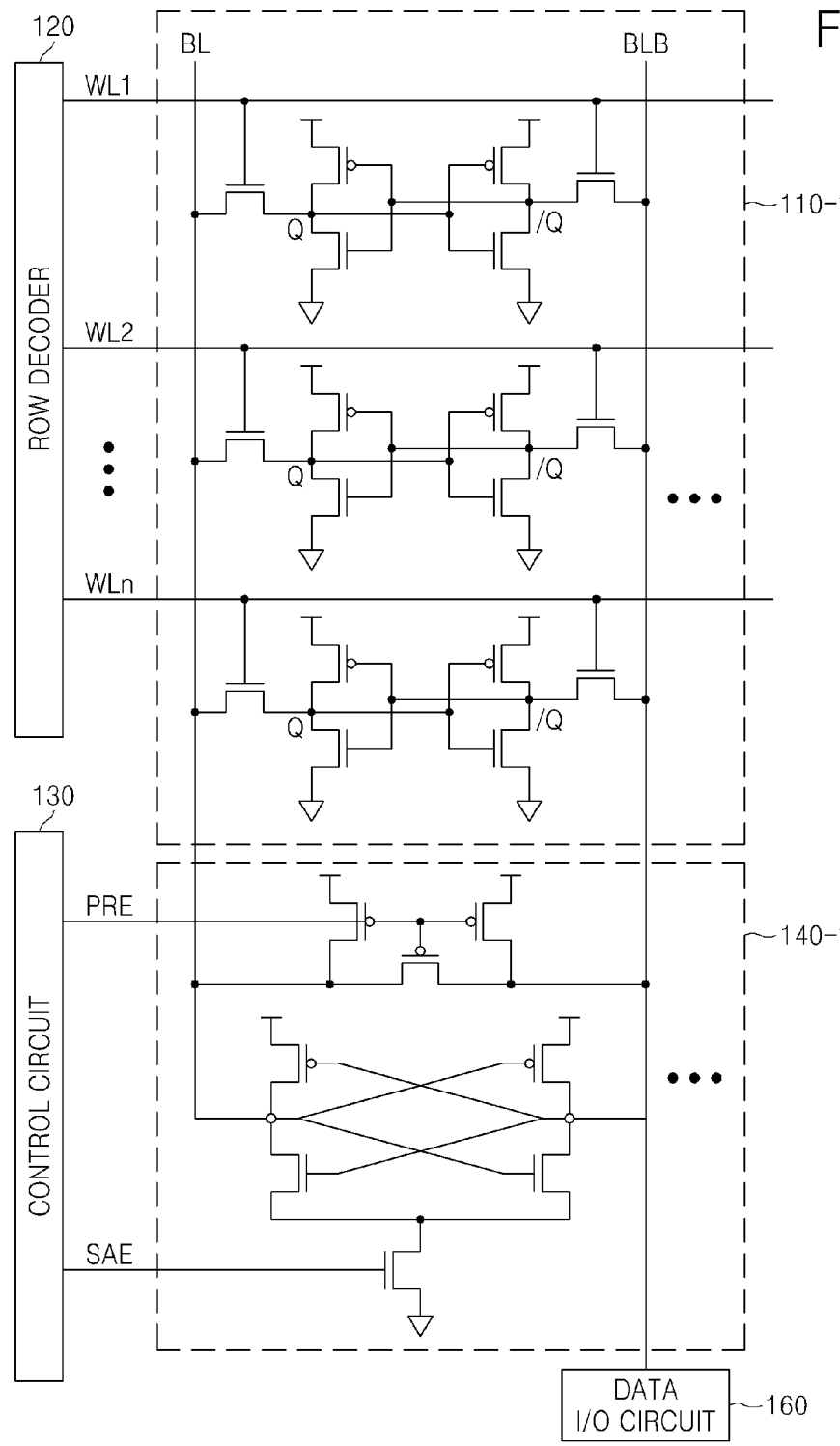
FIG. 2 is a circuit diagram of a memory cell array and a sense amplifier block illustrated in FIG. 1 according to certain embodiments of the inventive concept.

FIG. 2 is a circuit diagram of the memory cell array 110 and the sense amplifier block 140 illustrated in FIG. 1 according to certain embodiments of the inventive concept. FIG. 2 shows only a partial memory cell array 110-1 and a sense amplifier 140-1, which correspond to a single bit line among the bit lines BL1 through BLn. Referring to FIGS. 1 and 2, each of illustrated memory cells included in the partial memory cell array 110-1 includes a plurality of transistors connected between a bit line BL and a complementary bit line BLB that operatively form the single bit line. Data may be written to or read from a memory cell in response to control signal(s) applied via a word line selected by the row decoder 120.

In the embodiment illustrated in FIG. 2, each memory cell connected between the bit lines BL and BLB includes six transistors. However, those skilled in the art will recognize that a different number (and arrangement) of transistors may be used in other embodiments.

The control circuit 130 may be used to generate a sense amplifier enable signal SAE enabling the sense amplifier 140-1 corresponding to the pair of the bit lines BL and BLB and a pre-charge enable signal PRE pre-charging the pair of the bit lines BL and BLB for a subsequent operation after data transmitted from the pair of the bit lines BL and BLB is sensed and amplified.

In other words, the sense amplifier 140-1 senses and amplifies data communicated from a memory cell connected between the bit line BL and the complementary bit line BLB in response to the sense amplifier enable signal SAE, and outputs an amplified signal to the data I/O circuit 160.

Figure 3:
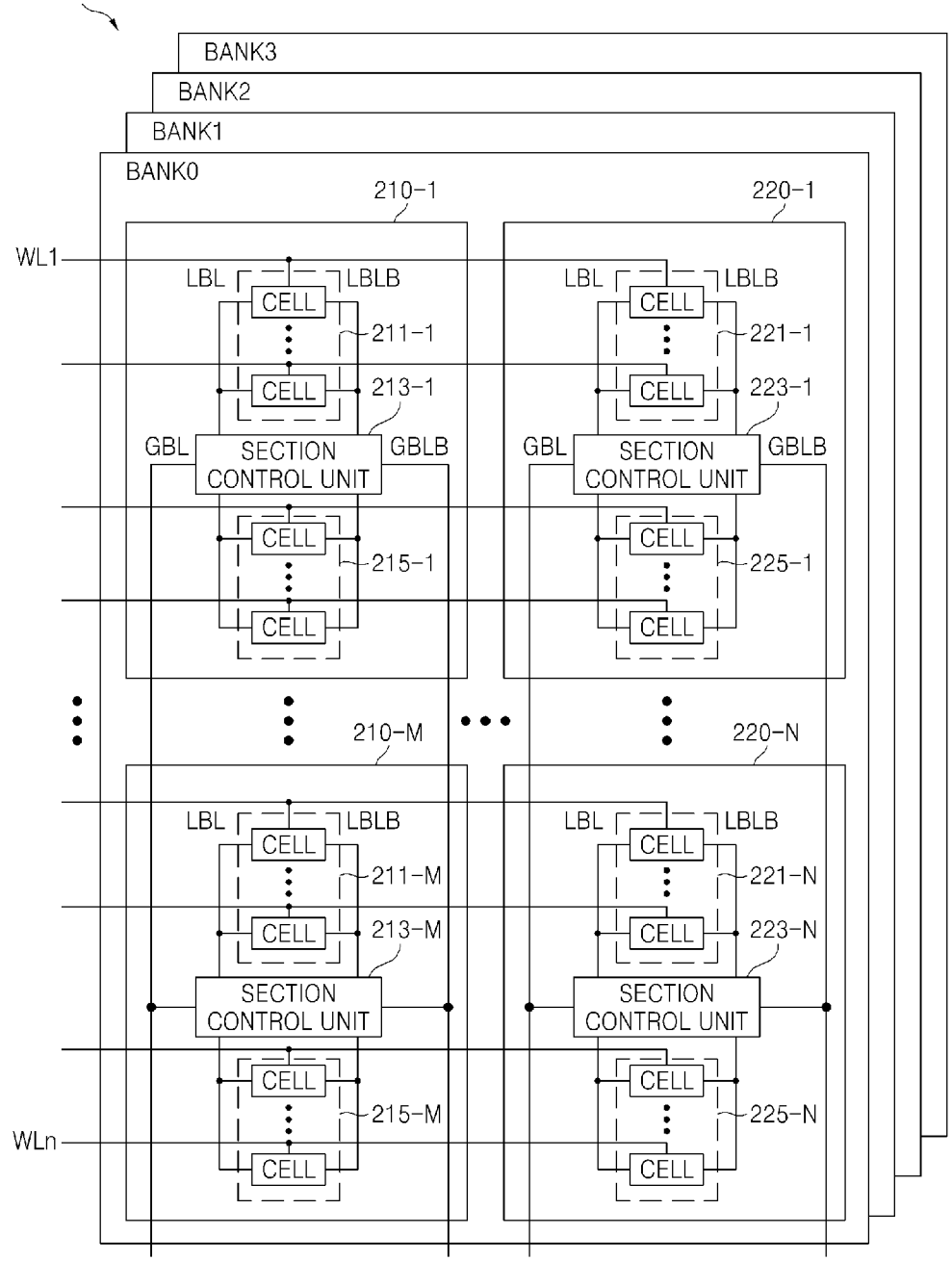
FIG. 3 is a circuit diagram of the memory cell array illustrated in FIG. 1, which includes a local bit line and a global bit line according to certain embodiments of the inventive concept.

FIG. 3 is a circuit diagram further illustrating the memory cell array 110 of FIG. 1, which includes a local bit line LBL and a global bit line GBL according to certain embodiments of the inventive concept. FIG. 3 shows one example of the semiconductor device 100 including four (4) memory banks BANK0 through BANK3, which have the functions of the memory cell array 110 and the sense amplifier block 140 as previously described in relation to FIG. 1. However, those skilled in the art will recognize that the number of memory banks included in the semiconductor device 100 may be vary with design.

Each of the four memory banks BANK0 through BANK3 includes a plurality of sections. Each of the sections includes a plurality of memory cell groups (e.g., a first memory cell group, a second memory cell group, etc.) and a corresponding section control unit.

For instance, the first memory bank BANK0 includes a plurality of sections 210-1 through 210-M and 220-1 through 220-N. Of these sections 210-1 through 210-M and 220-1 through 220-N, the first section 210-1 includes a first memory cell group 211-1, a section control unit 213-1, and a second memory cell group 215-1. Each of the memory cell groups 211-1 and 215-1 includes a plurality of memory cells.

Each of the memory cells included in a memory cell group may be "horizontally connected" between a local bit line LBL and a complementary local bit line LBLB. Section control units may be "vertically connected" between two memory cell groups while also being horizontally connected between a global bit line GBL and a complementary global bit line GBLB. (See, e.g., FIG. 3).

For instance, the section control unit 213-1 is connected between the first and second memory cell groups 211-1 and 215-1 and performs read control, write control, pre-charging and the function of a local sense amplifier on the plurality of memory cells connected thereto. This will be described in some additional detail with reference to FIGS. 6A and 6B hereafter.

Figure 4:
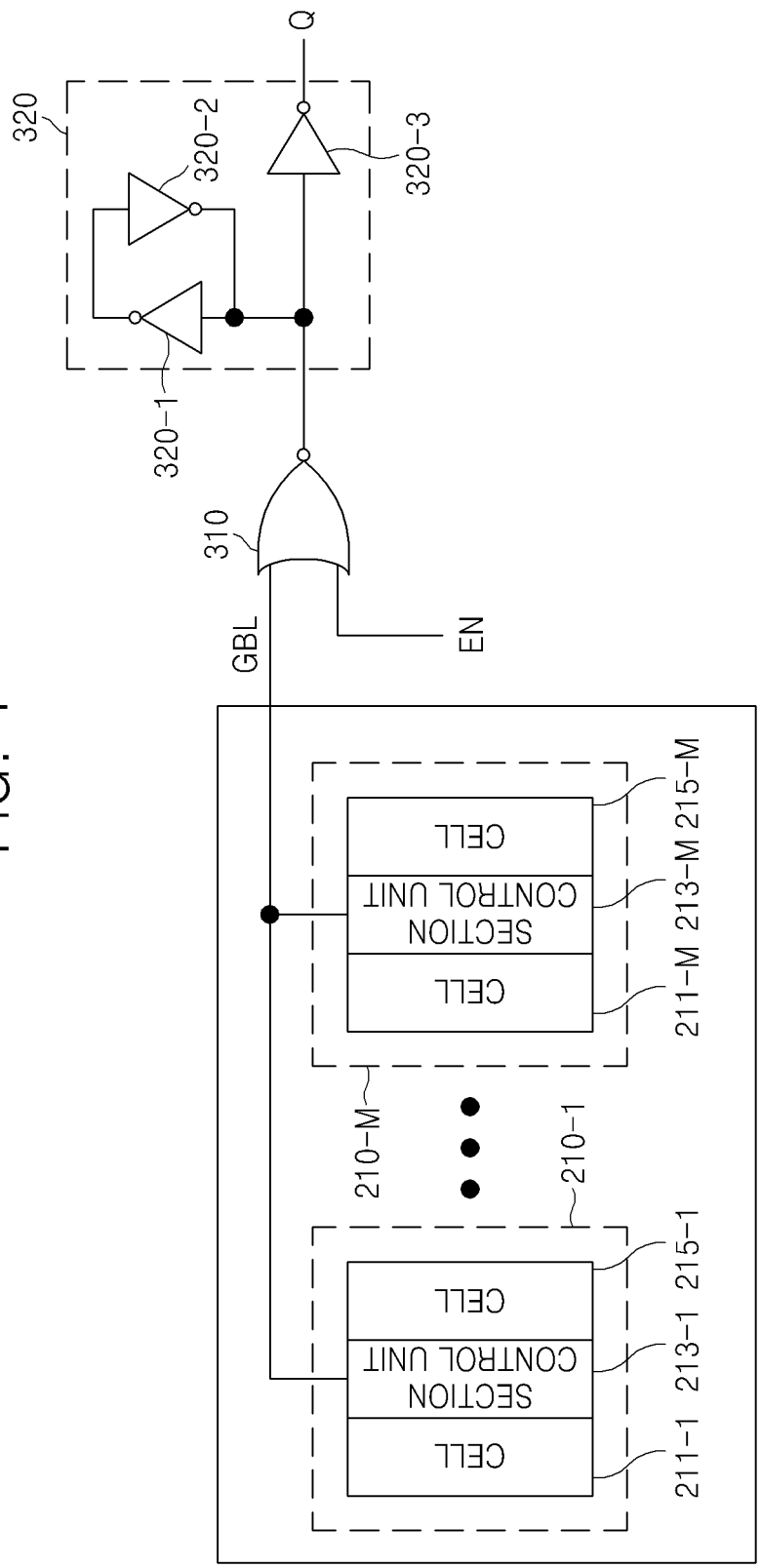
FIG. 4 is a circuit diagram of a memory cell array having a single-ended configuration as one comparative example.
Figure 7:
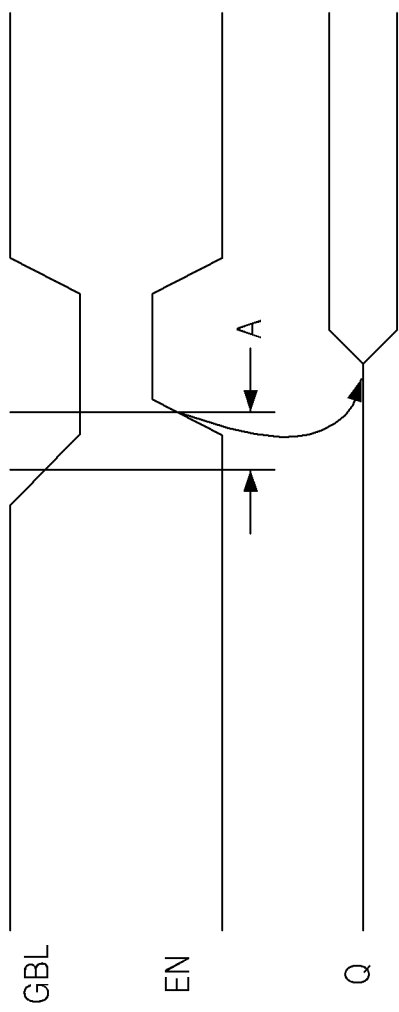
FIG. 7 is a timing diagram describing the operation of the memory cell array illustrated in FIG. 4.

FIG. 4 is a circuit diagram of the memory cell array 110 having a single-ended configuration as one comparative example. FIG. 7 is a timing diagram describing the operation of the memory cell array 110 of FIG. 4. For clarity of the description, FIG. 4 shows only one set of "vertically aligned" sections 210-1 through 210-M commonly connected to a global bit line GBL.

Referring to the illustrated example of FIG. 4, each section control units 213-1 through 213-M in the vertically aligned set of sections (e.g., 210_1 through 210_M) in the memory cell array 110 are commonly connected to a single (only one) global bit line GBL. Hence, any "read signal" (e.g., a dynamic signal) obtained during a read operation from a memory cell among the plurality of memory cells in the vertically aligned set of sections will is received by a NOR gate 310 via the global bit line GBL.

The NOR gate 310 outputs a result (hereafter, "a gated read signal") of a NOR operation between an enable signal EN provided by the control circuit 130 and the read signal received through the global bit line GBL.

In the illustrated example, a latch unit 320 includes first through third inverters 320-1, 320-2 and 320-3. The latch unit may be used to latch the gated read signal provided by the NOR gate 310 and to generate a corresponding latched read signal Q. In order to reliably generate the latched read signal in the latch unit 320 from the dynamic read signal communicated by the global bit line GBL, sufficient timing margin must be secured. Accordingly, the enable signal EN is required.

The timing diagram of FIG. 7 further illustrates this approach. In FIG. 7, the enable signal EN "activates" (or is active) (i.e., transition to a defined state that gates the read signal through the NOR gate 310) with the illustrated timing margin "A" in relation to the read signal provided via the global bit line GBL. When the enable signal EN is activated as shown, the timing margin A may be insufficient to ensure the generation of a stable (valid) gated read signal.

Figure 5:
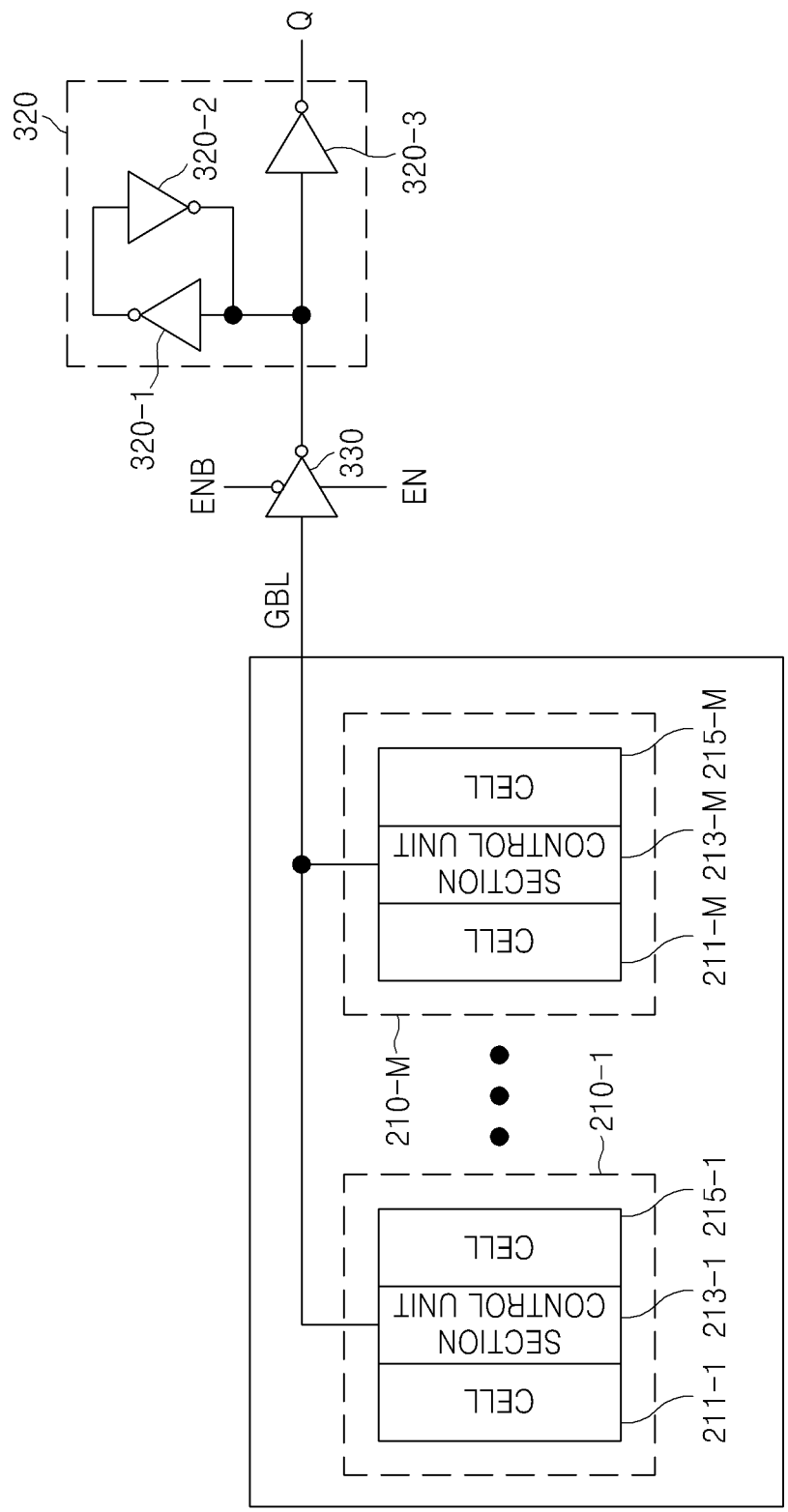
FIG. 5 is a circuit diagram of a memory cell array having the single-ended configuration as another comparative example.
Figure 8:
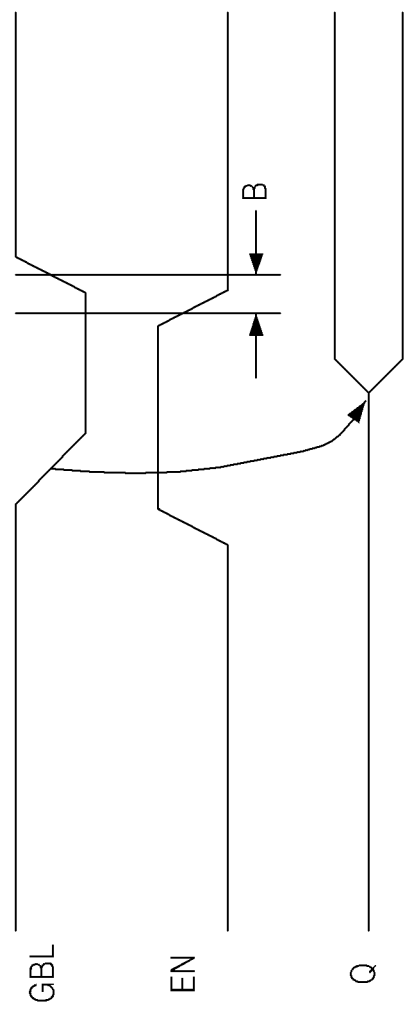
FIG. 8 is a timing diagram describing the operation of the memory cell array illustrated in FIG. 5.

FIG. 5 is a circuit diagram of the memory cell array 110 having the single-ended configuration as another comparative example. FIG. 8 is a timing diagram describing operation of the memory cell array 110 of FIG. 5. In the illustrated example of FIG. 5, the gated read signal is applied to the latch unit 320 by a tri-state inverter 330 instead of the NOR gate 310.

The tri-state inverter 330 inverts the read signal provided via the global bit line GBL in response to a enable signal EN and a complementary enable signal ENB. Thus, when the enable signal EN is active (e.g., is logically "high"), the tri-state inverter 330 inverts the read signal, but when the enable signal EN is inactive (e.g., is logically "low"), the gated read signal apparent at the output terminal of the tri-state inverter 330 is placed in a high impedance state (e.g., a hi-Z state).

As before, the latch unit 320 latches the gated read signal provided by the tri-state inverter 330 to generate the latched read signal Q. Thus, when the enable and complementary enable signals EN and ENB are active before the read signal provide via the global bit line GBL is communicated, the timing margin "A" shown in FIG. 7 can be secured, but considerable effort to appropriately adjust the timed application of the enable and complementary enable signals EN and ENB is required. In addition, the timing margin B of FIG. 8 is needed when the enable and complementary enable signals EN and ENB transit from the enabled state to the disabled state.

According to the circuits illustrated in FIGS. 4 and 5, since the semiconductor device 100 uses only a single global bit line GBL to communicate a read signal from memory cells during a read operation, a particular enable signal controlling timing margins relative to the read signal provided by the single global bit line GBL to the latch unit 320 is required.

Figure 6A:
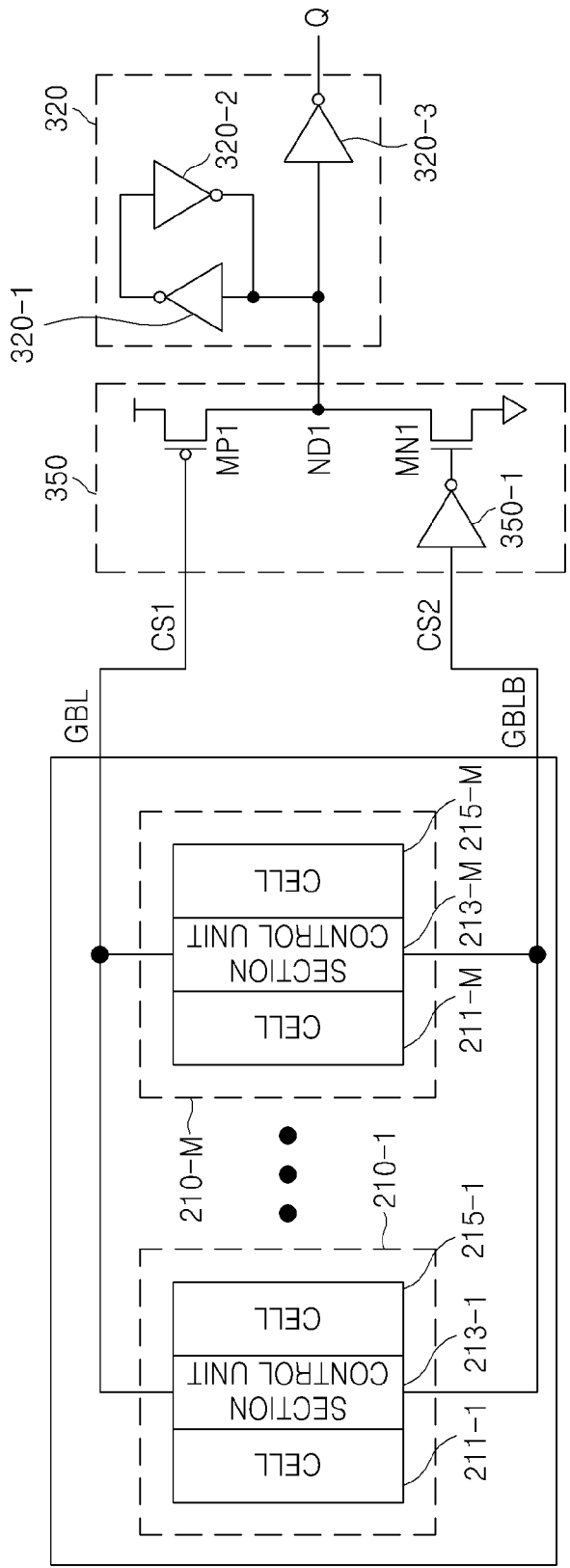
FIGS. 6A and 6B are circuit diagrams of a memory cell array having a dual-ended configuration according to certain embodiments of the inventive concept.
Figure 6B:
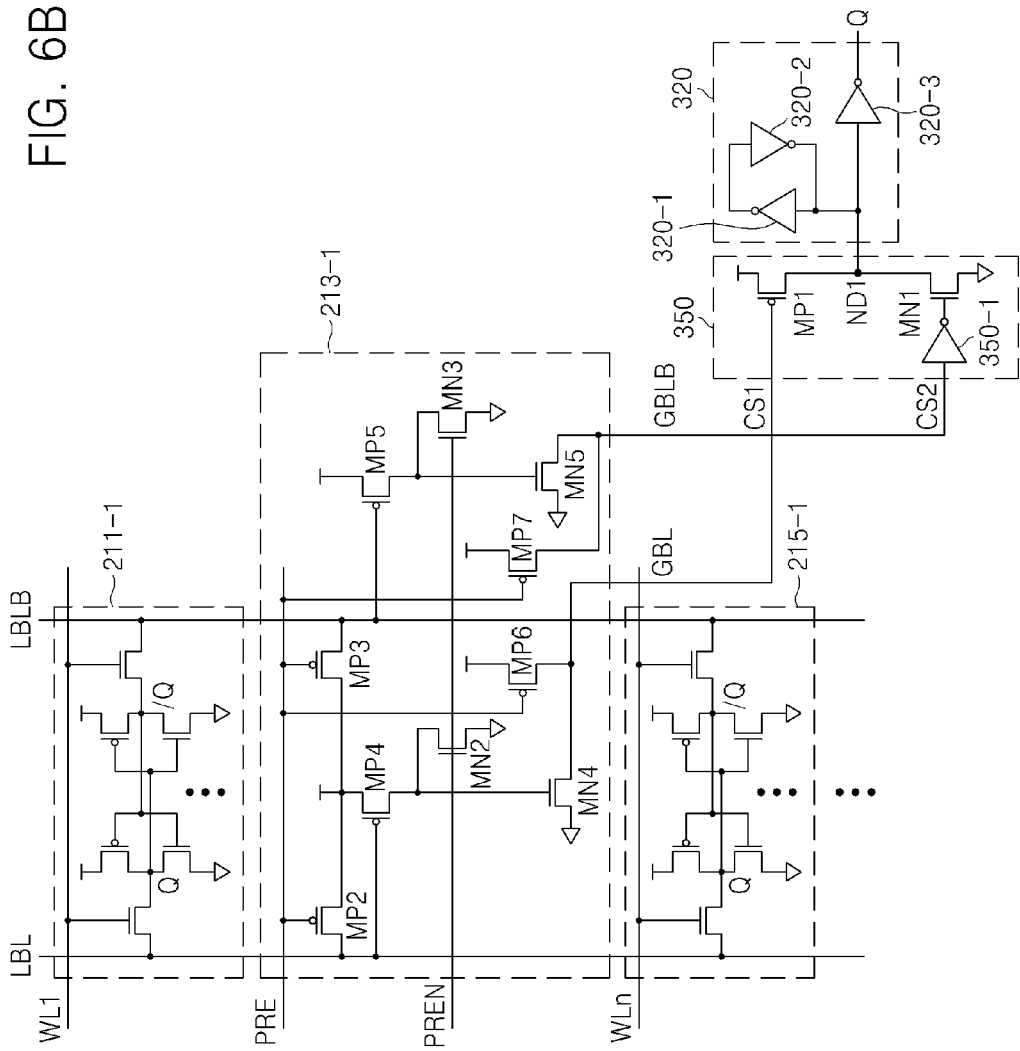
Figure 9:
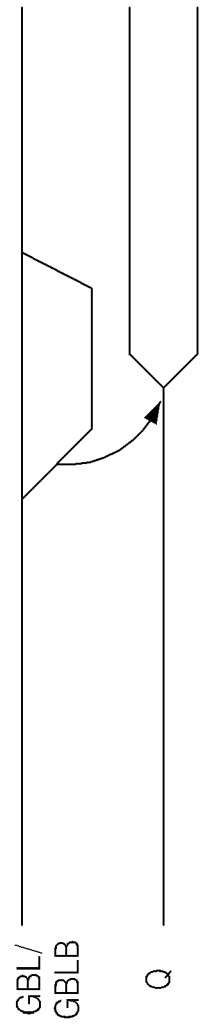
FIG. 9 is a timing diagram describing the operation of the memory cell array illustrated in FIGS. 6A and 6B.

In contrast, the embodiments shown in the circuit diagrams of FIGS. 6A and 6B use a dual-ended configuration according to certain embodiments of the inventive concept. FIG. 9 is a timing diagram describing the operation of the memory cell array 110 illustrated in FIGS. 6A and 6B. For clarity of the description, the sections 210-1 through 210-M corresponding to a single pair of global bit lines GBL and GBLB are illustrated in FIGS. 6A and 6B. Referring to FIGS. 1 through 3 and FIGS. 6A and 6B, the section control units 213-1 through 213-M are horizontally connected between a global bit line GBL and a corresponding, complementary global bit line GBLB, and a read signal provided by a memory cell among the plurality of cells in the vertically aligned set of sections is transmitted to a signal converter 350 via the pair of global bit line GBL and complementary global bit line GBLB.

In further detail, a first read signal CS1 communicated via the global bit line GBL and a second read signal CS2 communicated via the complementary global bit line GBLB are used to control the operation of the signal converter 350.

In the illustrated example, the signal converter 350 includes a first transistor MP1, an inverter 350-1, and a second transistor MN1.

The first transistor MP1 is connected between a power supply voltage VDD and a first node ND1 and operates in response to the first read signal CS1 received through the global bit line GBL. The inverter 350-1 inverts the second read signal CS2 received through the complementary global bit line GBLB and outputs an inverted second read signal. The second transistor MN1 is connected between the first node ND1 and a ground voltage VSS and operates in response to the inverted second read signal provided by the inverter 350-1. However, those skilled in the art will recognize that the signal converter may be otherwise implemented.

In this manner, the signal converter 350 may be used to generate a "controlled read signal" (analogous to the gated read signal previously described in relation to FIGS. 4 and 5) having a stable level (or value) defined by the first read signal CS1 and second read signal CS2. This controlled read signal may then be applied to the latch unit 320. The latch unit 320 latches a signal received through the first transistor MP1 or the second transistor MN1 for a period before a subsequent controlled read signal is received.

In other words, dynamic read signals provided by a memory cell from among the plurality of memory cells included in the memory cell groups 211-1 through 211-M and 215-1 through 215-M and then sensed and amplified by a corresponding one of the section control units 213-1 through 213-M, is communicated via the global bit line GBL and complementary global bit line GBLB and applied to the signal converter 350 as control signals.

Referring to FIG. 6B, a row selection signal (not shown) generated by the row decoder 120 selects a memory cell from which data will be read. A read signal provided from the selected memory cell is communicated to the corresponding section control unit 213-1 via a pair of the local bit lines LBL and LBLB and is then amplified by local sense amplifiers MP4, MP5, MN4 and MN5 included in the section control unit 213-1. Amplified versions of the read signals are then transmitted through the global bit line GBL and the complementary global bit line GBLB as first and second read signals. These signals are then applied to control the operation of the signal converter 350, and therefore may be understood as first and second control signals.

First pre-chargers MP2, MP3, MN2 and MN3 included in the section control unit 213-1 pre-charge the pair of the local bit lines LBL and LBLB based on a first pre-charge signal PRE and a second pre-charge signal PREN, which are received from the control circuit 130 for a subsequent operation, and second pre-chargers MP6 and MP7 included in the section control unit 213-1 pre-charge the pair of global bit lines GBL and GBLB based on the first pre-charge signal PRE.

As further illustrated in FIG. 9, when a value of "0" is applied to the section control unit 213-1 as the first pre-charge signal PRE generated by the control circuit 130, transistors included in the second pre-chargers MP6 and MP7 are turned ON, pre-charging the global bit line GBL and the complementary global bit line GBLB, and the first and second transistors MP1 and MN1 are turned OFF. In this state, when the value of the first read signal CS1 communicated via the global bit line GBL is changed to "0", only the first transistor MP1 is turned ON and a value of "1" is output to the first node ND1. As a result, the latched read signal Q output from the latch unit 320 has a value of "0".

In the state where the global bit line GBL and the complementary global bit line GBLB have been pre-charged, when a value of the second read signal CS2 communicated via the complementary global bit line GBLB is changed to "0", only the second transistor MN1 is turned ON and a value of "0" is output to the first node ND1. As a result, the latched read signal Q output from the latch unit 320 has a value of "1". Accordingly, the first read signal CS1 and the second read signal CS2 will respectively have values that are complementary to each other.

Since a value communicated via only one bit line changes in the state where the global bit line GBL and the complementary global bit line GBLB have been pre-charged, the latched (static) read signal Q is output, thereby securing sufficient timing margin with reduced design complexity.

Figure 10:
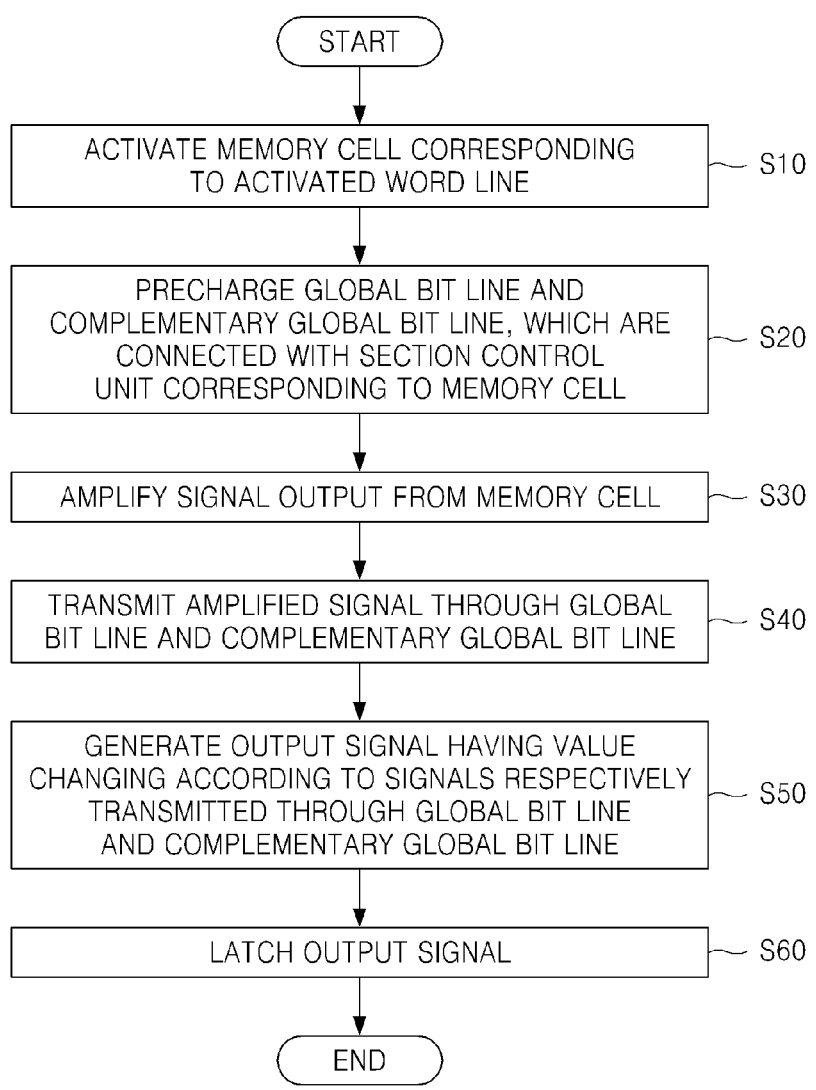
FIG. 10 is a flowchart summarizing one possible method of converting a dynamic read signal into a corresponding latched read signal according to certain embodiments of the inventive concept.

FIG. 10 is a flowchart summarizing one possible method of converting a dynamic read signal into a corresponding latched (stable) read signal according to certain embodiments of the inventive concept. Referring to FIGS. 1 through 10, a memory cell corresponding to an activated word line among the word lines WL1 through WLn of the semiconductor device 100 is activated (S10).

The control circuit 130 applies the first and second pre-charge signals PRE and PREN to the global bit line GBL and the complementary global bit line GBLB, respectively, which are connected to a section control unit corresponding to the activated memory cell, to pre-charge the global bit line GBL and the complementary global bit line GBLB (S20).

Next, when the control circuit 130 does not apply a write enable signal to the section control unit, the memory cell outputs a signal corresponding to the value stored therein and the section control unit senses and amplifies the signal (S30).

The section control unit transmits the amplified signal to the first transistor MP1 connected with the global bit line GBL and to the second transistor MN1 through the inverter 350-1 connected with the complementary global bit line GBLB (S40).

The signal converter 350 receives signals communicated via the global bit line GBL and the complementary global bit line GBLB, respectively, as a first read signal CS1 and a second read signal CS2 and outputs a controlled read signal having a value that is defined by (changing according to) the first read signal CS1 and the second read signal CS2 (S50).

The latch unit 320 latches the signal received from the first transistor MP1 or the second transistor MN1 for a period before receiving a subsequent output signal (S60).

Accordingly, in the illustrated embodiments, the semiconductor device 100 is able to convert a fairly dynamic read signal amplified by a section control unit into a corresponding controlled (static) read signal using the global bit line GBL and the complementary global bit line GBLB without additionally using a trigger signal or an enable signal. Nonetheless, sufficient timing margin may be obtained for the output signal.

Figure 11:
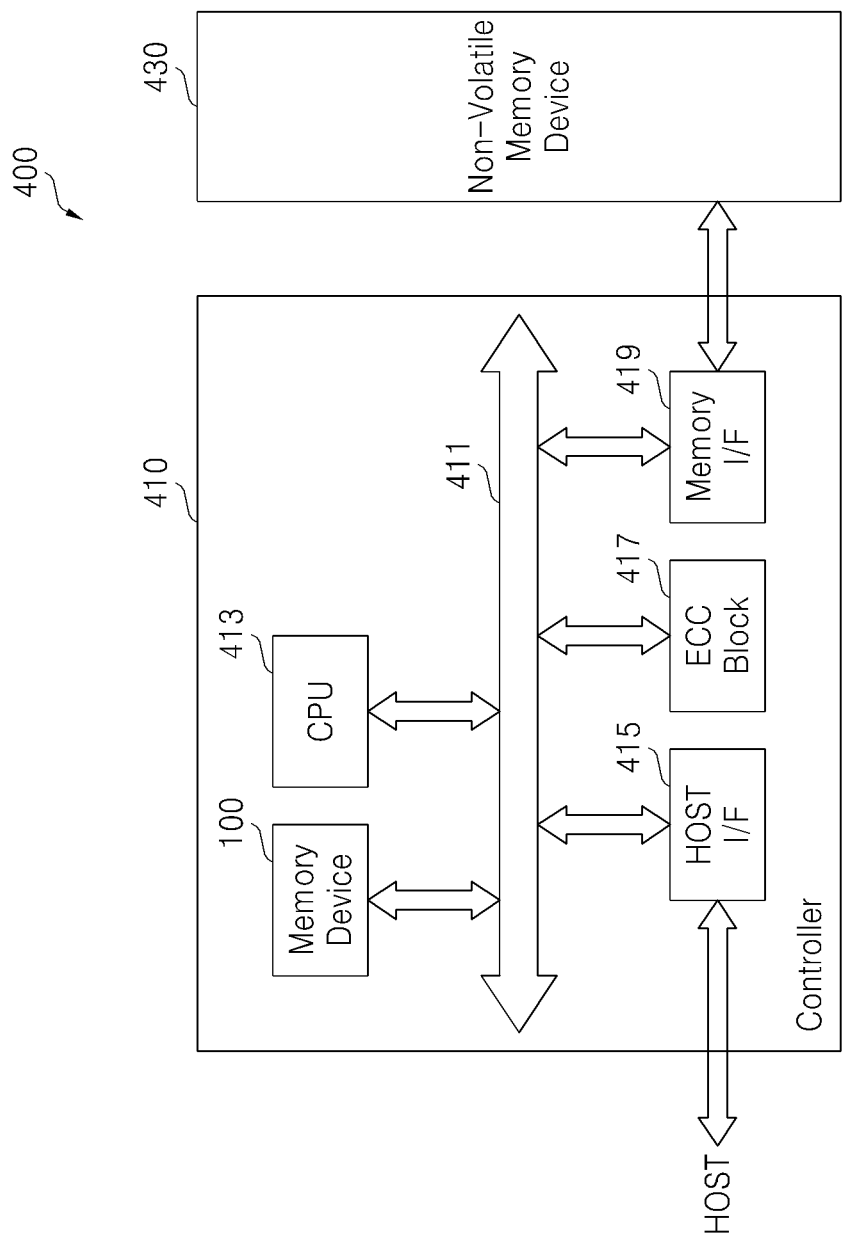
FIG. 11 is a block diagram of a memory system including the memory device illustrated in FIG. 1 according to certain embodiments of the inventive concept.

FIG. 11 is a block diagram of a memory system including the memory device illustrated in FIG. 1 according to certain embodiments of the inventive concept. Referring to FIG. 11, the memory system 400 includes the non-volatile memory device 430 and a memory controller 410 controlling the operations of the non-volatile memory device 430. The memory controller 410 may include a central processing unit (CPU) 413 controlling the operations of the non-volatile memory device 430. The CPU 413 may be a microprocessor.

The memory device 100 may be used as an operation memory of the CPU 413. The memory device 100 may be implemented by a static random access memory (SRAM). A host interface 415 may perform data communication between a host and the memory controller 410 according to a protocol of the host connected with the memory system 400.

An error correction code (ECC) block 417 may detect an error bit included in data output from the non-volatile memory device 430, and correct the error bit. A memory interface 419 may perform data communication between the non-volatile memory device 430 and the memory controller 410.

The CPU 413 may control data communication among the host interface 415, the ECC block 417, the memory interface 419, and the memory device 100 through a bus 411. The memory system 400 may be implemented as a flash memory drive, a USB memory drive, an IC-USB memory drive, or a memory stick.

Figure 12:
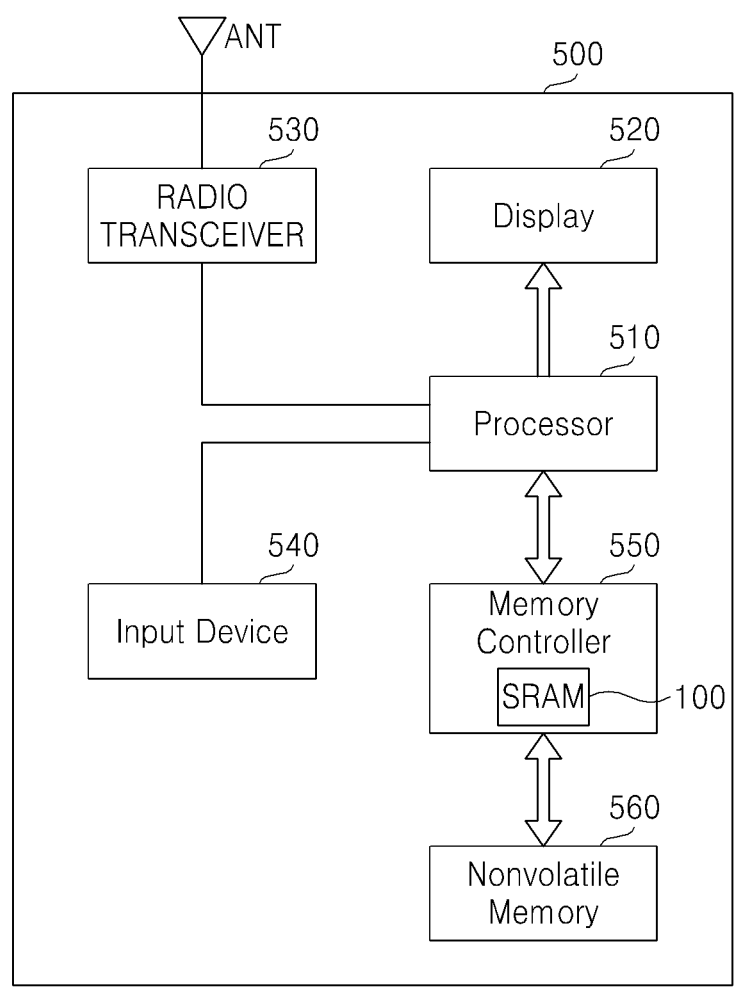
FIG. 12 is a block diagram of a memory system including the memory device illustrated in FIG. 1 according to certain embodiments of the inventive concept.

FIG. 12 is a block diagram of a memory system including the memory device illustrated in FIG. 1 according to certain embodiments of the inventive concept. Referring to FIG. 12, the memory system 500 may be implemented as a cellular phone, a smart phone, a tablet personal computer (PC), a personal digital assistant (PDA), a portable multimedia player (PMP) or a radio communication system.

The memory system 500 includes the non-volatile memory device 560 and a memory controller 550 controlling the operations of the non-volatile memory device 560. The memory controller 550 may control the data access operations, e.g., a program operation, an erase operation, and a read operation, of the non-volatile memory device 560 according to the control of a processor 510.

The memory controller 550 may include SRAM 100 for storing data output from the non-volatile memory device 560. The SRAM 100 may temporarily store data output from the non-volatile memory device 560. The data stored in the SRAM 100 may be transmitted to the processor 510.

A radio transceiver 530 transmits or receives radio signals through an antenna ANT. The radio transceiver 530 may convert radio signals received through the antenna ANT into signals that can be processed by the processor 510. Accordingly, the processor 510 may process the signals output from the radio transceiver 530 and transmit the processed signals to the memory controller 550 or the display 520. The memory controller 550 may program the signals processed by the processor 510 to the non-volatile memory device 560.

The radio transceiver 530 may also convert signals output from the processor 510 into radio signals and outputs the radio signals to an external device through the antenna ANT.

An input device 540 enables control signals for controlling the operation of the processor 510 or data to be processed by the processor 110 to be input to the memory system 500. The input device 540 may be implemented by a pointing device such as a touch pad or a computer mouse, a keypad, or a keyboard.

The processor 510 may control the operation of the display 520 to display data output from the memory controller 550, data output from the radio transceiver 530, or data output from the input device 540. According to some embodiments, the memory controller 550, which controls the operations of the non-volatile memory device 560, may be implemented as a part of the processor 510 or as a separate chip.

According to certain embodiments, the memory controller 550 and the non-volatile memory device 560 may be implemented as one package such as a multi-chip package.

Figure 13:
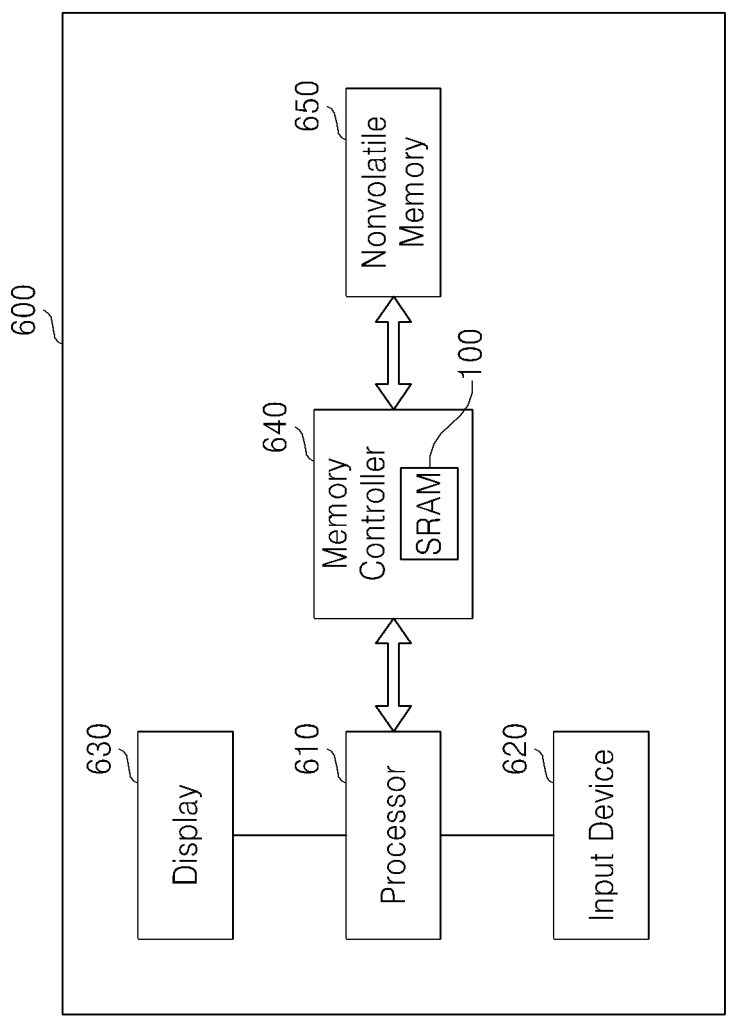
FIG. 13 is a block diagram of a memory system including the memory device illustrated in FIG. 1 according to certain embodiments of the inventive concept.

FIG. 13 is a block diagram of a memory system including the memory device illustrated in FIG. 1 according to other embodiments of the inventive concept. Referring FIG. 13, the memory system 600 may be implemented as a PC, a tablet PC, a net-book, an e-reader, a PDA, a portable multimedia player (PMP), an MP3 player, or an MP4 player.

The memory system 600 includes the non-volatile memory device 650 and a memory controller 640 controlling the data processing operations of the non-volatile memory device 650. The memory controller 640 may include SRAM 100. The SRAM 100 may temporarily store data output from the non-volatile memory device 650. The data stored in the SRAM 100 may be transmitted to a processor 610.

The processor 610 may display data stored in the non-volatile memory device 650 through a display 630 according to data input through an input device 620. The input device 620 may be implemented by a pointing device such as a touch pad or a computer mouse, a keypad, or a keyboard.

The processor 610 may control the overall operation of the memory system 600 and the operations of the memory controller 640. According to some embodiments, the memory controller 640, which may control the operations of the non-volatile memory device 650, may be implemented as a part of the processor 610 or as a separate chip.

According to some embodiments, the memory controller 640 and the non-volatile memory device 650 may be implemented as one package such as a multi-chip package.

Figure 14:
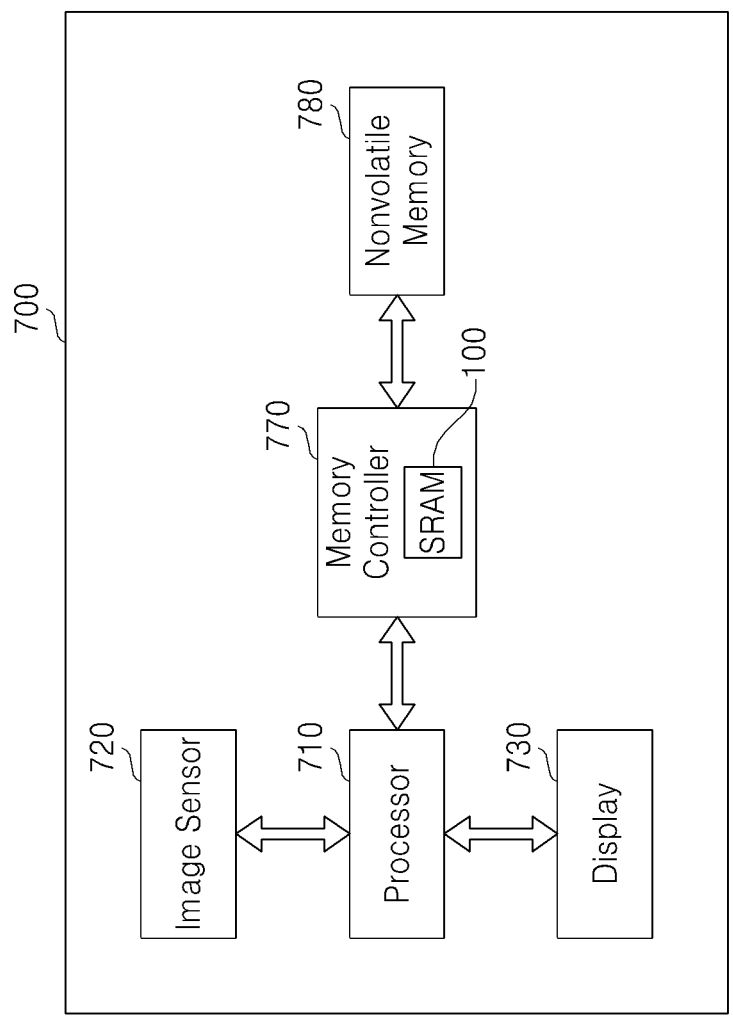
FIG. 14 is a block diagram of a memory system including the memory device illustrated in FIG. 1 according to certain embodiments of the inventive concept.

FIG. 14 is a block diagram of a memory system including the memory device illustrated in FIG. 1 according to yet other embodiments of the inventive concept. Referring FIG. 14, the memory system 700 may be implemented as an image processor like a digital camera, a cellular phone equipped with a digital camera, a smart phone equipped with a digital camera, or a tablet PC equipped with a digital camera.

The memory system 700 includes the non-volatile memory device 780 and a memory controller 770 controlling the data processing operations, such as a program operation, an erase operation, and a read operation, of the non-volatile memory device 780.

The memory controller 770 may include SRAM 100 for temporarily storing data output from the non-volatile memory device 780 or data to be output to the non-volatile memory device 780.

An image sensor 720 included in the memory system 700 converts optical images into digital signals and outputs the digital signals to a processor 710 or the memory controller 770. The digital signals may be controlled by the processor 710 to be displayed through a display 730 or stored in the non-volatile memory device 780 through the memory controller 770.

Data stored in the non-volatile memory device 780 may be displayed through the display 730 according to the control of the processor 710 or the memory controller 770. According to some embodiments, the memory controller 770, which controls the operations of the non-volatile memory device 780, may be implemented as a part of the processor 710 or as a separate chip.

Certain embodiments of the inventive concept may be embodied, wholly or in part, as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium may be accessed via distributed networks coupled computer systems so that the computer-readable code is stored and executed in a distributed fashion. Also, functional programs, codes, and code segments to accomplish the present general inventive concept can be easily construed by programmers.

As described above, according to embodiments of the inventive concept, a semiconductor device may efficiently convert a dynamic read signal obtained during a read operation into a corresponding controlled (stable or static) read signal using a dual bit line structure without the additional requirement of a trigger signal or an enable signal. Nonetheless, sufficient timing margin may be obtained albeit with reduced design complexity.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A semiconductor device comprising:
a plurality of memory banks, wherein each memory bank in the plurality of memory banks includes a plurality of sections arranged between a global bit line and a complementary global bit line, and each section in the plurality of sections includes a first memory cell group and a second memory cell group connected between a local bit line and a complementary local bit line and a section control unit disposed between the first memory cell group and the second memory cell group, wherein the section control unit is connected between the global bit line and the complementary global bit line to provide a first read signal to the global bit line and a second read signal to the complementary global bit line in response to a read operation directed to a memory cell in one of the first memory cell group and the second memory cell group;
a signal converter that receives the first read signal via the global bit line and the second read signal via the complementary global bit line in response to the read operation and generates a stable controlled read signal indicative of a data value stored in the memory cell; and
a latch unit that receives and latches the controlled read signal provided by the signal converter to generate a latched read signal.

2. The semiconductor device of claim 1, wherein the signal converter comprises:
a first transistor connected between a power supply voltage and a first node that operates in response to the first read signal;
an inverter that inverts the second read signal to generate an inverted second read signal; and
a second transistor connected between the first node and a ground voltage that operates in response to the inverted second read signal.

3. The semiconductor device of claim 2, wherein the first transistor is a P-type metal oxide semiconductor (PMOS) transistor and the second transistor is an N-type metal oxide semiconductor (NMOS) transistor.

4. The semiconductor device of claim 3, wherein the first read signal and the second read signal are different.

5. The semiconductor device of claim 4, wherein the first read signal and the second read signal are complementary.

6. The semiconductor device of claim 1, wherein the section control unit comprises:
a first pre-charger that pre-charges the local bit line and the complementary local bit line in response to a pre-charge signal;
a second pre-charger that pre-charges the global bit line and the complementary global bit line in response to the pre-charge signal; and
a local sense amplifier configured to sense and amplify signals respectively received through the local bit line and the complementary local bit line.

7. A method of operating a semiconductor device, wherein the semiconductor device includes a plurality of sections arranged between a global bit line and a complementary global bit line, each section including a first memory cell group and a second memory cell group connected between a local bit line and a complementary local bit line and a section control unit disposed between the first memory cell group and the second memory cell group and connected between the global bit line and the complementary global bit line, the method comprising:
pre-charging the global bit line and the complementary global bit line;
sensing and amplifying a dynamic read signal provided by a memory cell during a read operation to provide a first read signal via the global bit line and a second read signal via the complementary global bit line, wherein the first read signal is different from the second read signal;
generating a stable controlled read signal having a value defined by the first read signal and the second read signal, as respectively communicated via the global bit line and the complementary global bit line; and
latching the controlled read signal to generate a latched read signal.

8. The method of claim 7, wherein the generating of the stable controlled read signal comprises:
controlling operation of a first transistor in response to the first read signal; and
controlling operation of a second transistor in response to an inverted version of the second read signal,
wherein the first read signal and the second read signal are complementary.

9. The method of claim 8, wherein the first transistor is a P-type metal oxide semiconductor (PMOS) transistor and the second transistor is an N-type metal oxide semiconductor (NMOS) transistor.

10. A memory system comprising:
a non-volatile memory device; and
a memory controller configured to control operation of the non-volatile memory device and comprising a memory device and a microprocessor configured to control operation of the memory device,
wherein the memory device comprises:
a plurality of memory banks, wherein each memory bank in the plurality of memory banks includes a plurality of sections arranged between a global bit line and a complementary global bit line, and each section in the plurality of sections includes a first memory cell group and a second memory cell group connected between a local bit line and a complementary local bit line and a section control unit disposed between the first memory cell group and the second memory cell group, wherein the section control unit is connected between the global bit line and the complementary global bit line to provide a first read signal to the global bit line and a second read signal to the complementary global bit line in response to a read operation directed to a memory cell in one of the first memory cell group and the second memory cell group;
a signal converter that receives the first read signal via the global bit line and the second read signal via the complementary global bit line in response to the read operation and generates a stable controlled read signal indicative of a data value stored in the memory cell; and
a latch unit that receives and latches the controlled read signal provided by the signal converter to generate a latched read signal.

11. The memory system of claim 10, wherein the signal converter comprises; a first transistor connected between a power supply voltage and a first node that operates in response to the first read signal, an inverter that inverts the second read signal to generate an inverted second read signal, and a second transistor connected between the first node and a ground voltage that operates in response to the inverted second read signal.

12. The memory system of claim 11, wherein the first transistor is a P-type metal oxide semiconductor (PMOS) transistor and the second transistor is an N-type metal oxide semiconductor (NMOS) transistor.

13. The memory system of claim 10, wherein the first read signal and the second read signal are complementary.

14. The memory system of claim 10, wherein the section control unit comprises:
   a first pre-charger that pre-charges the local bit line and the complementary local bit line in response to a pre-charge signal;
   a second pre-charger that pre-charges the global bit line and the complementary global bit line in response to the pre-charge signal; and
   a local sense amplifier configured to sense and amplify signals respectively received through the local bit line and the complementary local bit line.

15. The memory system of claim 10, wherein the memory system is implemented as a multi-chip package.

16. The memory system of claim 10, further comprising:
   a display operating in response to the latched read signal.

17. The memory system of claim 10, further comprising:
   a transceiver operating under the control of a processor in response to the latched read signal.

18. The memory system of claim 10, further comprising:
   an input device that causes the data value to be stored in the memory cell prior to the read operation.

19. The memory system of claim 10, wherein the memory device is a Static Random Access Memory (SRAM).

20. The memory system of claim 10, further comprising:
   an image sensor that causes the data value to be stored in the memory cell prior to the read operation.

* * * * *